(12) United States Patent
Tanaka

(10) Patent No.: US 11,791,174 B2
(45) Date of Patent: Oct. 17, 2023

(54) SEMICONDUCTOR MANUFACTURING APPARATUS AND SEMICONDUCTOR MANUFACTURING METHOD

(71) Applicant: Mitsubishi Electric Corporation, Tokyo (JP)

(72) Inventor: Hiroshi Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/375,749

(22) Filed: Jul. 14, 2021

(65) Prior Publication Data

US 2021/0351046 A1 Nov. 11, 2021

Related U.S. Application Data

(62) Division of application No. 16/583,400, filed on Sep. 26, 2019, now Pat. No. 11,152,229.

(30) Foreign Application Priority Data

Oct. 24, 2018 (JP) .................................. 2018-199719

(51) Int. Cl.
*H01L 21/67* (2006.01)
*H01L 21/683* (2006.01)
*H01L 21/02* (2006.01)

(52) U.S. Cl.
CPC .. *H01L 21/67051* (2013.01); *H01L 21/02041* (2013.01); *H01L 21/67046* (2013.01); *H01L 21/6838* (2013.01)

(58) Field of Classification Search
None
See application file for complete search history.

(56) References Cited

U.S. PATENT DOCUMENTS 5,169,196 A * 12/1992 Safabakhsh ........ H05K 13/0409
271/97
5,492,566 A * 2/1996 Sumnitsch .......... H01L 21/6715
269/21

(Continued)

FOREIGN PATENT DOCUMENTS

CN 104813460 A 7/2015
CN 108074858 B * 4/2020 ....... H01L 21/67017

(Continued)

OTHER PUBLICATIONS

An Office Action; "Notice of Reasons for Refusal," mailed by the Japanese Patent Office dated Aug. 24, 2021, which corresponds to Japanese Patent Application No. 2018-199719 and is related to U.S. Appl. No. 17/375,749; with English language translation.

(Continued)

*Primary Examiner* — Michael E Barr
*Assistant Examiner* — Omair Chaudhri
(74) *Attorney, Agent, or Firm* — Studebaker & Brackett PC

(57) ABSTRACT

A semiconductor manufacturing apparatus includes a chuck stage, a scrubber nozzle, a scrubber nozzle scan mechanism, a stage rotation mechanism, and a holding stage including a holding fluid nozzle and a top plate, the top plate having one main surface facing an opposite surface of a wafer, and the holding fluid nozzle being disposed adjacent to a center rather than a periphery portion of the top plate. A holding fluid discharged from the holding fluid nozzle is caused to flow through an area between the opposite surface of the wafer and the one main surface of the top plate to produce holding force, and the holding force causes the opposite surface to hold pressure applied to a processing surface of the wafer by a scrubbing fluid discharged from the scrubber nozzle.

5 Claims, 13 Drawing Sheets

(56) References Cited

U.S. PATENT DOCUMENTS

| | | | |
|---|---|---|---|
| 5,979,475 A * | 11/1999 | Satoh | H01L 21/67017 |
| | | | 134/140 |
| 6,770,151 B1 | 8/2004 | Ravkin et al. | |
| 7,767,026 B2 | 8/2010 | Miya | |
| 7,914,626 B2 | 3/2011 | Uchida et al. | |
| 9,607,844 B2 | 3/2017 | Okuda et al. | |
| 2002/0096196 A1 | 7/2002 | Toshima et al. | |
| 2002/0134512 A1 * | 9/2002 | Adachi | H01L 21/68728 |
| | | | 156/345.17 |
| 2003/0000034 A1 | 1/2003 | Welsh et al. | |
| 2003/0168174 A1 * | 9/2003 | Foree | C30B 25/12 |
| | | | 118/728 |
| 2004/0065540 A1 | 4/2004 | Mayer et al. | |
| 2005/0023773 A1 * | 2/2005 | Matsuzawa | H01L 21/68728 |
| | | | 279/35 |
| 2005/0193952 A1 * | 9/2005 | Goodman | H01L 21/68735 |
| | | | 118/728 |
| 2005/0284369 A1 * | 12/2005 | Miya | H01L 21/6838 |
| | | | 118/500 |
| 2007/0141951 A1 * | 6/2007 | Naoki | H01L 21/67051 |
| | | | 451/5 |
| 2008/0229811 A1 * | 9/2008 | Zhao | F16C 32/0603 |
| | | | 73/104 |
| 2008/0280453 A1 * | 11/2008 | Koelmel | H01L 21/6838 |
| | | | 438/758 |
| 2009/0277379 A1 * | 11/2009 | Ohmi | G11B 7/261 |
| | | | 118/302 |
| 2010/0200545 A1 * | 8/2010 | Koelmel | H01L 21/6838 |
| | | | 156/345.55 |
| 2011/0130009 A1 * | 6/2011 | Kumnig | G03F 7/423 |
| | | | 156/345.21 |
| 2011/0151675 A1 * | 6/2011 | Frank | H01L 21/67034 |
| 2011/0265816 A1 * | 11/2011 | Chen | H01L 21/67046 |
| | | | 134/6 |
| 2012/0125376 A1 * | 5/2012 | Ohmi | H01L 21/6708 |
| | | | 134/33 |
| 2013/0011225 A1 * | 1/2013 | Goodman | H01L 21/68785 |
| | | | 414/225.01 |
| 2013/0048607 A1 * | 2/2013 | Matsushita | H01L 21/68764 |
| 2013/0213437 A1 * | 8/2013 | Ishii | F16C 32/0603 |
| | | | 73/104 |
| 2013/0220368 A1 * | 8/2013 | Ishibashi | H01L 21/0209 |
| 2014/0109941 A1 * | 4/2014 | Miyanari | H01L 21/67132 |
| | | | 279/3 |
| 2014/0242885 A1 * | 8/2014 | Nakao | H01L 21/67115 |
| 2015/0325466 A1 * | 11/2015 | Wang | H01L 21/6838 |
| | | | 438/758 |
| 2016/0005636 A1 * | 1/2016 | Ichinose | G03F 7/70908 |
| | | | 269/21 |
| 2016/0118274 A1 * | 4/2016 | Hace | H01L 21/68785 |
| | | | 34/236 |
| 2016/0237565 A1 * | 8/2016 | Sieber | C23C 16/45544 |
| 2016/0314994 A1 | 10/2016 | Singh et al. | |
| 2017/0243735 A1 * | 8/2017 | Kaba | H01L 21/68735 |
| | | | 118/728 |
| 2017/0316960 A1 * | 11/2017 | Ishibashi | C30B 25/12 |
| | | | 118/728 |
| 2018/0040502 A1 * | 2/2018 | Kon | H05K 13/0409 |
| | | | 271/97 |
| 2018/0096879 A1 * | 4/2018 | Kon | H01L 21/67115 |
| 2018/0151343 A1 * | 5/2018 | Takiguchi | H01L 21/0209 |
| 2019/0043740 A1 * | 2/2019 | Miyahara | H01L 21/67034 |
| 2019/0074208 A1 * | 3/2019 | Chiu | H01L 21/6838 |
| 2019/0198363 A1 * | 6/2019 | Shimai | H01L 21/67051 |
| 2019/0295864 A1 * | 9/2019 | Itonaga | H01L 21/67253 |
| 2019/0311938 A1 * | 10/2019 | Chen | H01L 21/68764 |
| 2020/0009702 A1 * | 1/2020 | Cheng | B24B 29/02 |
| 2020/0101624 A1 * | 4/2020 | Sakata | H01L 21/67766 |
| 2020/0161146 A1 * | 5/2020 | Goldberg | H01L 21/67326 |
| 2021/0086236 A1 * | 3/2021 | Nakazawa | H01L 21/68742 |

FOREIGN PATENT DOCUMENTS

| | | | | |
|---|---|---|---|---|
| JP | 2006186117 A | | 7/2006 | |
| JP | 2015-537385 A | | 12/2015 | |
| JP | 2016-149420 A | | 8/2016 | |
| JP | 2017188695 A | | 10/2017 | |
| JP | 2018-006368 A | | 1/2018 | |
| JP | 2018-026557 A | | 2/2018 | |
| KR | 20170113388 A | * | 10/2017 | ....... H01L 21/02057 |
| WO | WO-2011002155 A2 | * | 1/2011 | ........... B65G 49/065 |
| WO | WO-2018171909 A1 | * | 9/2018 | ......... H01L 21/6838 |

OTHER PUBLICATIONS

An Office Action mailed by China National Intellectual Property Administration dated Mar. 7, 2023, which corresponds to Chinese Patent Application No. 201910993980.2 and is related to U.S. Appl. No. 17/375,749; with English language translation.

An Office Action issued by the German Patent and Trademark Office dated Aug. 8, 2023, which corresponds to German Patent Application No. 102019216066.2 and is related to U.S. Appl. No. 17/375,749; with English language translation.

\* cited by examiner

F I G. 4
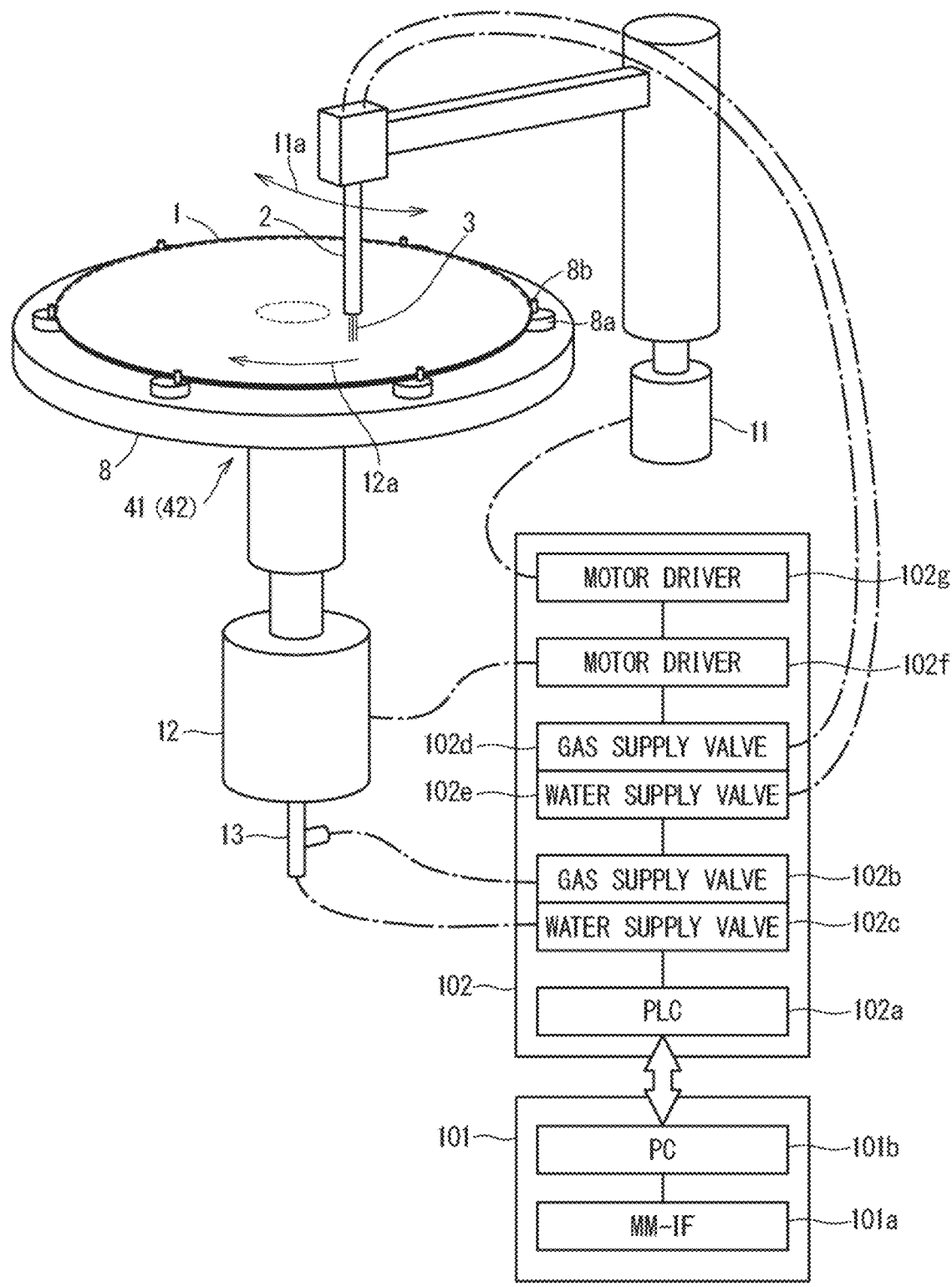

F I G. 6
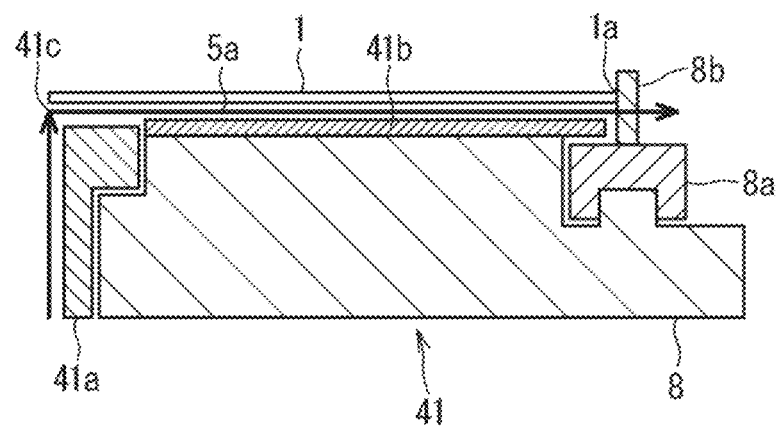
F I G. 7
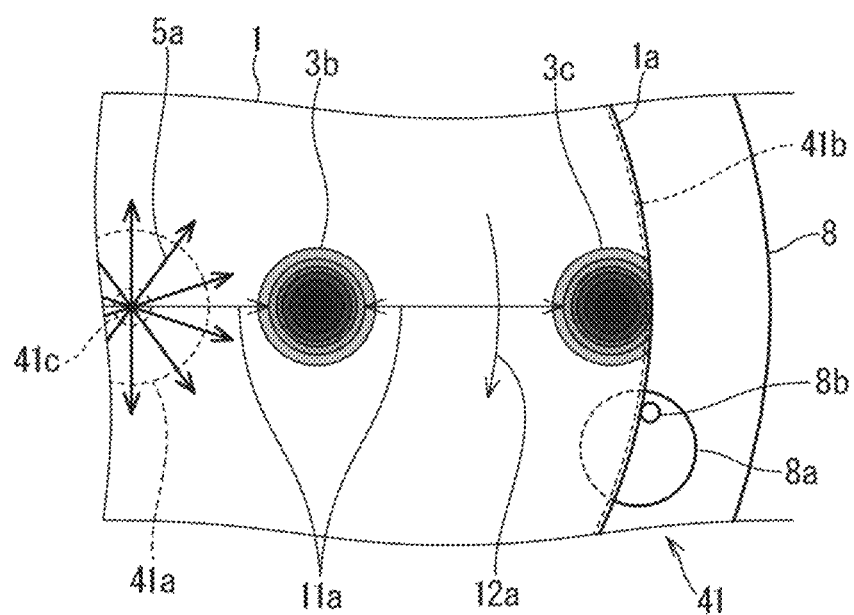

SEMICONDUCTOR MANUFACTURING APPARATUS AND SEMICONDUCTOR MANUFACTURING METHOD

CROSS-REFERENCE TO RELATED APPLICATIONS

This application is a Divisional of U.S. patent application Ser. No. 16/583,400 filed on Sep. 26, 2019, which claims benefit of priority to Japanese Patent Application No. 2018-199719 filed Oct. 24, 2018, the entire content of which is incorporated herein by reference.

BACKGROUND OF THE INVENTION

Field of the Invention

The present invention relates to a technique for discharging a fluid to a semiconductor wafer to remove foreign substances.

Description of the Background Art

During a semiconductor manufacturing process, foreign substances such as fine particles and dust may sometimes adhere to a processing surface of a semiconductor wafer. Such foreign substances cause a circuit to malfunction, for example, and thus it is necessary to remove the foreign substances adhering to the processing surface of the semiconductor wafer. Example of a method for removing foreign substances adhering to the processing surface of the semiconductor wafer include a technique for discharging a fluid to the processing surface of the semiconductor wafer (see, for example, Japanese Patent Application Laid-Open No. 2017-188695).

A description will be given of a commonly-used technique for discharging a fluid to the processing surface of the semiconductor wafer. Hereinafter, the "semiconductor wafer" is simply referred to as a "wafer". For the purpose of simplification, a description will be given only of a portion representing a relation between a wafer and a chuck pin. The wafer is supported against gravity by a support pin and is held by the chuck pin in a radial direction. In this state, the wafer is processed while being rotated together with a chuck stage.

When the wafer is processed to be thin, pressure of a scrubbing fluid discharged from a scrubber nozzle onto the processing surface of the wafer may cause the wafer to be easily warped and bring a surface opposed to the processing surface into contact with the chuck stage, and the contact may damage the wafer. This prevents the pressure of the scrubbing fluid from being increased enough to remove foreign substances, and accordingly a problem arises that an ability to remove foreign substances to a satisfactory degree cannot be obtained. Here, the surface opposed to the processing surface of the wafer corresponds to an opposite surface opposed to the processing surface of the wafer.

In particular, when the scrubber nozzle is located near an end portion of the wafer, the pressure of the scrubbing fluid is likely to cause the wafer to crack from the support pin. This prevents the scrubber nozzle from being moved to the end portion of the wafer, and accordingly the foreign substances remaining on the end portion of the wafer may cause a problem in subsequent processes.

Further, according to the technique described in Japanese Patent Application Laid-Open No. 2017-188695, a pressurized fluid supplied through a fluid supply path spreads all over a support surface of a support stage, and the support surface of the support stage receives a load applied to a substrate. However, since the support stage does not support an end portion of the substrate and the vicinity of the end portion, the support stage cannot receive the load applied to the vicinity of the end portion of the substrate, and accordingly an ability to remove foreign substances all over the wafer to a satisfactory degree cannot be obtained.

SUMMARY

The present invention has been made to solve the above-described problems, and it is therefore an object of the present invention to provide a semiconductor manufacturing apparatus and a semiconductor manufacturing method that have an ability to remove foreign substances all over even a wafer processed to be thin to a satisfactory degree.

A semiconductor manufacturing apparatus according to the present invention includes a chuck stage, a scrubber nozzle, a scrubber nozzle scan mechanism, a stage rotation mechanism, and a holding stage. The chuck stage holds a wafer using its end portion. The scrubber nozzle discharges a scrubbing fluid to a processing surface of the wafer. The scrubber nozzle scan mechanism causes the scrubber nozzle to perform a scan on the processing surface of the wafer. The stage rotation mechanism rotates the chuck stage. The holding stage includes a holding fluid nozzle and a top plate. The holding fluid nozzle discharges a holding fluid to an opposite surface of the wafer opposed to the processing surface. The top plate has one main surface facing the opposite surface of the wafer, and the holding fluid nozzle is disposed adjacent to a center rather than a periphery portion of the top plate. The holding fluid discharged from the holding fluid nozzle is caused to flow through an area between the opposite surface of the wafer and the one main surface of the top plate to produce holding force over the area, and the holding force causes the opposite surface to hold pressure applied by the scrubbing fluid discharged from the scrubber nozzle to the processing surface of the wafer.

Even with a wafer processed to be thin, an ability to remove foreign substances all over a wafer to a satisfactory degree can be obtained.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a schematic view showing a part of a processing chamber of the semiconductor manufacturing apparatus according to the first preferred embodiment;

FIG. 6 is a schematic view showing a stage structure including a chuck stage and a holding stage incorporated into the chuck stage of the semiconductor manufacturing apparatus according to the first preferred embodiment;

FIG. 7 is a schematic plan view of the range shown in FIG. 6;

DESCRIPTION OF THE PREFERRED EMBODIMENTS

Underlying Technology

Figure 16:
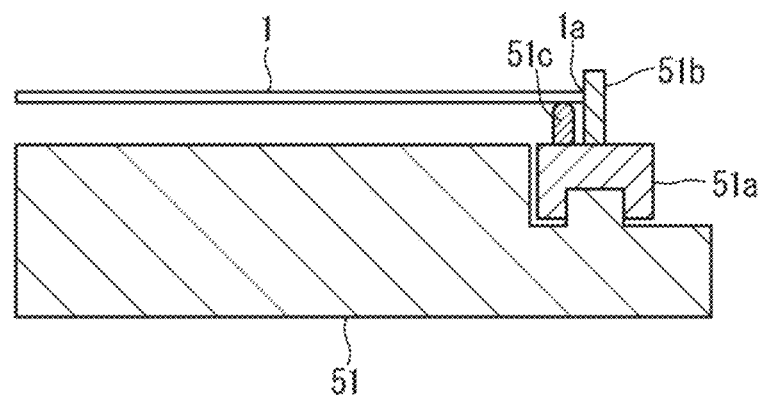
FIG. 16 is a schematic view showing a stage structure of a semiconductor manufacturing apparatus according to an underlying technology.
Figure 17:
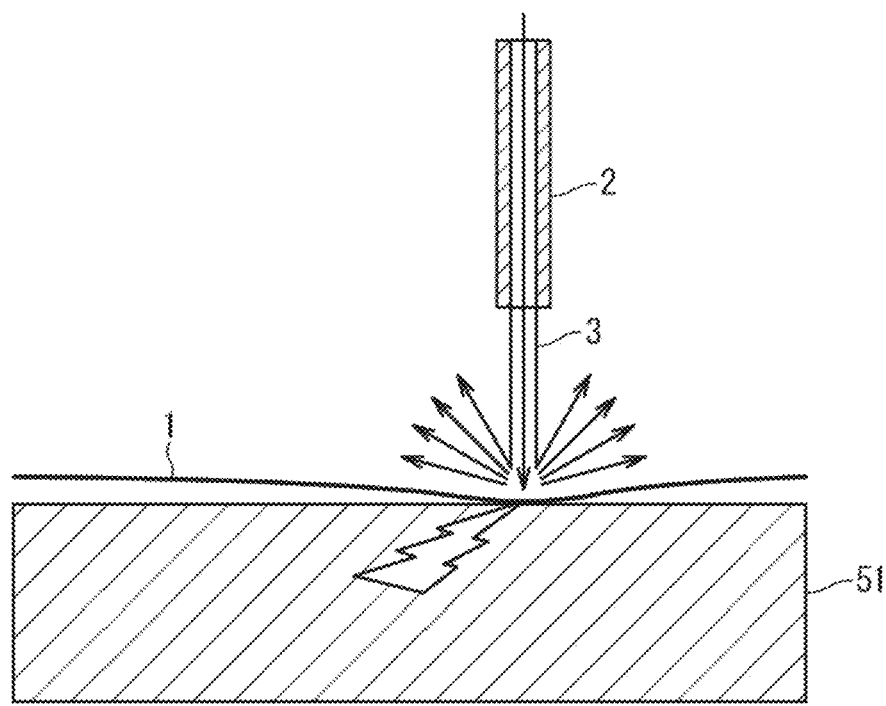
FIG. 17 is a schematic view showing a case where a scrubber nozzle is located remote from a wafer end portion of the semiconductor manufacturing apparatus according to the underlying technology.
Figure 18:
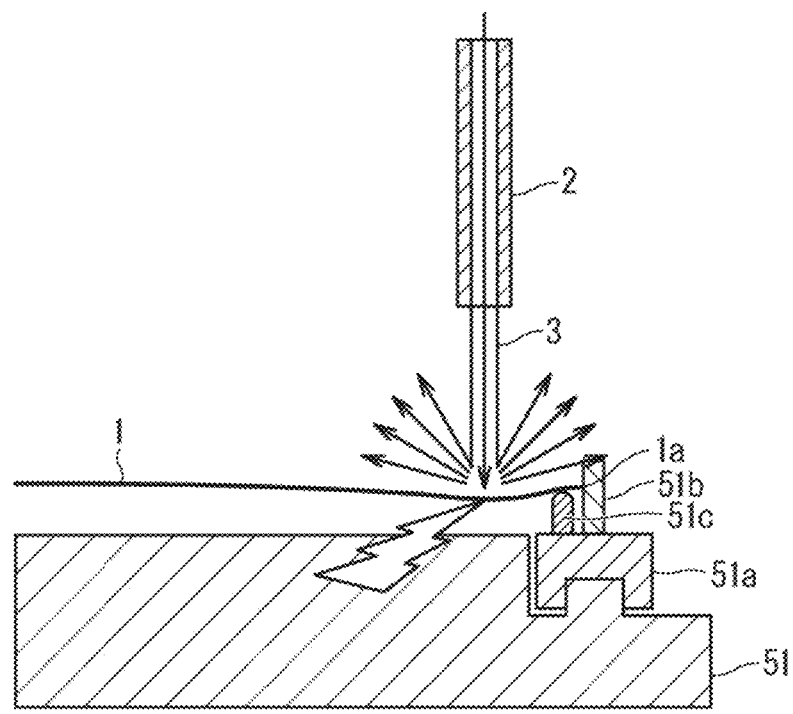
FIG. 18 is a schematic view showing a case where the scrubber nozzle is located in the vicinity of the wafer end portion of the semiconductor manufacturing apparatus according to the underlying technology.

Before describing the preferred embodiments of the present invention, a description will be given of a semiconductor manufacturing apparatus according to an underlying technology. FIG. 16 is a schematic view showing a stage structure of the semiconductor manufacturing apparatus according to the underlying technique. FIG. 17 is a schematic view showing a case where a scrubber nozzle 2 is located remote from a wafer end portion 1a of the semiconductor manufacturing apparatus according to the underlying technology. FIG. 18 is a schematic view showing a case where the scrubber nozzle 2 is located in the vicinity of the wafer end portion 1a of the semiconductor manufacturing apparatus according to the underlying technology. For the purpose of simplification, a description will be given only of a portion representing a relation between a wafer 1 and a chuck pin 51b.

As shown in FIG. 16 and FIG. 17, the semiconductor manufacturing apparatus according to the underlying technology includes a chuck stage 51 and the scrubber nozzle 2.

The chuck stage 51 has a circular shape and includes a plurality of chuck pin bases 51a, chuck pins 51b, and support pins 51c arranged on a periphery portion of the chuck stage 51. The wafer 1 is supported against gravity by the support pins 51c and is held by the chuck pins 51b in a radial direction. In this state, the wafer 1 is processed while being rotated together with the chuck stage 51.

As shown in FIG. 17, when the wafer 1 is processed to be thin, pressure of a scrubbing fluid 3 discharged from the scrubber nozzle 2 onto a processing surface may cause the wafer 1 to be easily warped and bring a surface opposed to the processing surface into contact with the chuck stage 51, and the contact may damage the wafer 1. This prevents the pressure of the scrubbing fluid 3 from being increased enough to remove foreign substances, and accordingly a problem arises that an ability to remove foreign substances to a satisfactory degree cannot be obtained.

In particular, as shown in FIG. 18, when the scrubber nozzle 2 is located in the vicinity of the wafer end portion 1a, the pressure of the scrubbing fluid 3 is likely to cause the wafer 1 to crack from the support pin 51c. This prevents the scrubber nozzle 2 from being moved to the wafer end portion 1a, and accordingly the foreign substances remaining on the wafer end portion 1a may cause a problem in subsequent processes. The preferred embodiments of the present invention to be described below are intended to solve such problems.

First Preferred Embodiment

Figure 1A:
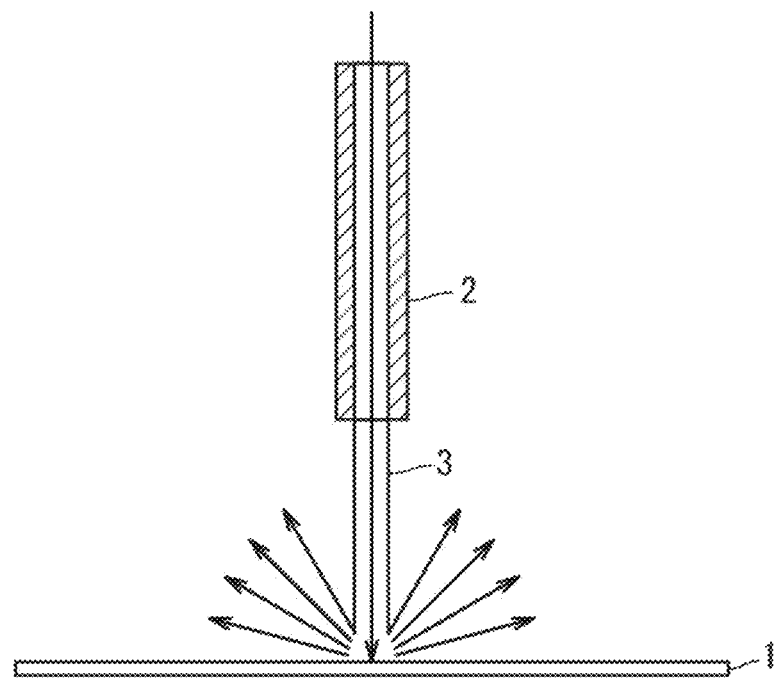
FIGS. 1A and 1B are schematic views showing a scrubbing fluid and a pressure distribution of the scrubbing fluid of a semiconductor manufacturing apparatus according to a first preferred embodiment.
Figure 1B:
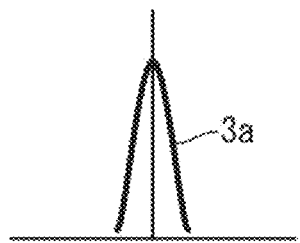
Figure 2:
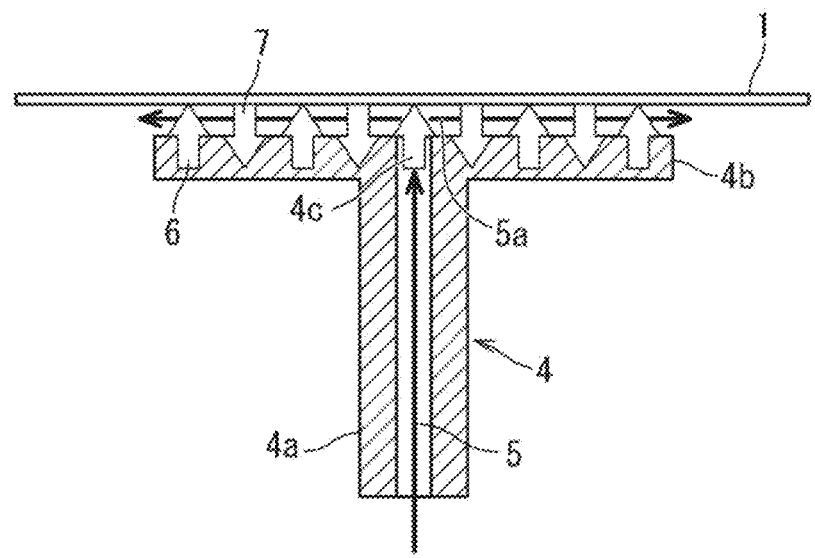
FIG. 2 is a schematic view showing wafer-holding pressure and wafer-holding pulling force of the semiconductor manufacturing apparatus according to the first preferred embodiment.
Figure 3:
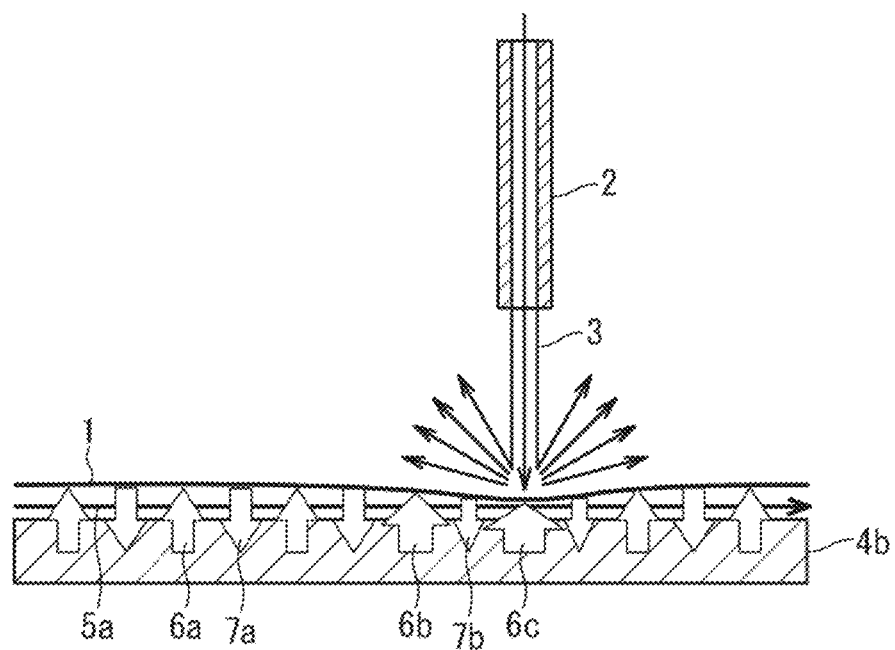
FIG. 3 is a schematic view showing the wafer-holding pressure and the wafer-holding pulling force inside and outside a scrubbing range of the semiconductor manufacturing apparatus according to the first preferred embodiment.

A description will be given below of a first preferred embodiment of the present invention with reference to the drawings. First, a brief description will be given of features of a semiconductor manufacturing apparatus according to the first preferred embodiment with reference to FIG. 1A to FIG. 3. FIG. 1A is a schematic view showing a scrubbing fluid 3 of the semiconductor manufacturing apparatus according to the first preferred embodiment, and FIG. 1B is a schematic view showing a pressure distribution of the scrubbing fluid 3. FIG. 2 is a schematic view showing wafer-holding pressure 6 and wafer-holding pulling force 7. FIG. 3 is a schematic view showing wafer-holding pressure 6a, 6b, 6c and wafer-holding pulling force 7a, 7b inside and outside a scrubbing range.

The semiconductor manufacturing apparatus according to the first preferred embodiment includes a holding stage 4, and the holding stage 4 includes a holding fluid nozzle 4a configured to discharge a holding fluid 5 to the surface opposed to the processing surface of the wafer 1 and a top plate 4b having a flat surface that is one main surface facing the surface opposed to the processing surface of the wafer 1 and the holding fluid nozzle 4a is disposed adjacent to a center rather than a periphery portion of the top plate 4b. Causing the holding fluid 5 discharged from the holding fluid nozzle 4a to flow through an area between the surface opposed to the processing surface of the wafer 1 and the flat surface of the top plate 4b produces holding force over the area. The holding force causes the surface opposed to the processing surface of the wafer 1 to hold pressure applied by the scrubbing fluid 3 discharged from the scrubber nozzle 2 to the processing surface of the wafer 1. In other words, the area includes a section corresponding to a range of the processing surface of the wafer 1 where pressure equal to or greater than a predetermined degree is locally applied by the scrubbing fluid 3 discharged from the scrubber nozzle 2.

Here, the processing surface of the wafer 1 is an upper surface of the wafer 1. The surface opposed to the processing surface of the wafer 1 is an opposite surface of the wafer 1 opposed to the processing surface, and more specifically, a lower surface of the wafer 1.

The holding force includes pressure of the holding fluid 5 and pulling force produced by a flow velocity of the holding fluid 5, and it can be assumed that a distance between the surface opposed to the processing surface of the wafer 1 and the flat surface of the top plate 4b is determined primarily by a balance between the pressure and the pulling force. The pressure and the pulling force vary depending on a distance from the holding fluid nozzle 4a, and thus the distance between the surface opposed to the processing surface of the wafer 1 and the flat surface of the top plate 4b also varies depending on the distance from the holding fluid nozzle 4a.

As shown in FIGS. 1A, 1B, the scrubbing fluid 3 discharged from the scrubber nozzle 2 may be liquid, gas, or a mixture of liquid and gas. Typically, the liquid is pure water, or water made from pure water and carbon dioxide dissolved in the pure water, and the gas is nitrogen or air. As means for mixing liquid and gas, it is common to mix pure water or water made from pure water and carbon dioxide dissolved in the pure water, and nitrogen or air using a two-fluid nozzle. In any case, when a discharge port of the scrubber nozzle 2 has a circular shape, a pressure distribution 3a of the scrubbing fluid 3 shows that the larger the distance from a center of the circular shape of the discharge port is, the lower the pressure becomes. Therefore, a range of the application of pressure equal to or greater than a predetermined degree that damages the wafer 1 processed to be thin also becomes a circular range around the center of the discharge port. Hereinafter, a description will be given of an example where a two-fluid nozzle having a circular discharge port is used as the scrubber nozzle 2.

As shown in FIG. 2, the holding stage 4 includes the holding fluid nozzle 4a and the top plate 4b. When being supplied, the holding fluid 5 flows through the holding fluid nozzle 4a, and then becomes a holding fluid 5a that flows between the wafer 1 and the top plate 4b from a holding fluid discharge port 4c formed at a connection portion of the holding fluid nozzle 4a with the top plate 4b. The holding fluid 5 is under pressure for supplying the holding fluid 5, and the pressure becomes wafer-holding pressure 6, and pulling force produced by the flow velocity of the holding fluid 5a flowing between the wafer 1 and the top plate 4b becomes the wafer-holding pulling force 7. Surfaces along which the holding fluid 5a flows are the surface opposed to the processing surface of the wafer 1 and the flat surface of the top plate 4b. Since the upper surface of the top plate 4b is the flat surface, the wafer-holding pressure 6 and the wafer-holding pulling force 7 are prevented from being nonuniform, and the holding force including the wafer-holding pressure 6 and the wafer-holding pulling force 7 is also prevented from being nonuniform.

As shown in FIG. 3, in a portion of the wafer 1 processed to be thin where the pressure of the scrubbing fluid 3 is applied, the wafer 1 is warped, and the distance between the surface opposed to the processing surface of the wafer 1 and the flat surface of the top plate 4b becomes smaller, thereby increasing a pressure loss and thus preventing the fluid from smoothly flowing. This decreases pulling force in the scrubbing range, such as the wafer-holding pulling force 7b and increases pressure of an upstream fluid such as the wafer-holding pressure 6b on an upstream side of the scrubbing range and the wafer-holding pressure 6c at the center of the scrubbing, which is considered to act to support the pressure distribution 3a of the scrubbing fluid 3. Note that, in FIG. 3, 6a denotes wafer-holding pressure outside the scrubbing range, and 7a denotes wafer-holding pulling force outside the scrubbing range.

With an area where the holding force is produced between the surface opposed to the processing surface of the wafer 1 and the flat surface of the top plate 4b including a range of the processing surface of the wafer 1 where pressure equal to or greater than a predetermined degree is locally applied by the scrubbing fluid 3, the use of the above-described action achieves a stage structure that prevents the surface opposed to the processing surface from being brought into contact with, by the pressure of the scrubbing fluid 3, parts of a mechanism such as a chuck stage facing the surface opposed to the processing surface. Furthermore, in view of the fact that the distance between the surface opposed to the processing surface of wafer 1 and the flat surface of the top plate 4b is determined primarily by the balance between pressure and pulling force, a chuck structure without need of the support pin from which a crack starts is achieved. Hereinafter, a description will be given of specific preferred embodiments.

FIG. 4 is a schematic view showing a part of a processing chamber of the semiconductor manufacturing apparatus according to the first preferred embodiment. Note that, for the sake of easy viewing, a portion that is not directly related to the technique for removing foreign substances will be omitted from the drawings, and, for the purpose of simplification, a description will be given only of a portion related to the technique for removing foreign substances.

As shown in FIG. 4, the semiconductor manufacturing apparatus includes a chuck stage 8, the scrubber nozzle 2, a scrubber nozzle scan mechanism 11, a stage rotation mechanism 12, a holding stage 41, a holding fluid supply pipe 13, an operation PC 101, and a control PLC 102. Alternatively, the semiconductor manufacturing apparatus includes a holding stage 42 instead of the holding stage 41. Here, a description will be given of a configuration where the semiconductor manufacturing apparatus includes the holding stage 41.

The chuck stage 8 has a circular shape in plan view and holds the wafer 1 using an end portion of the chuck stage 8. Specifically, a plurality of chuck pin bases 8a are arranged at predetermined intervals on a periphery portion of the chuck stage 8, and a plurality of chuck pins 8b are provided upright on the plurality of chuck pin bases 8a. Each of the chuck pins 8b is movable between an outer circumferential side and an inner circumferential side. Moving the plurality of chuck pins 8b to the outer circumferential side to open the plurality of chuck pins 8b allows the wafer 1 to be loaded onto the chuck stage 8. Further, moving the plurality of chuck pins 8b to the inner circumferential side to close the plurality of chuck pins 8b causes the plurality of chuck pins 8b to hold the end portion of the wafer 1.

The scrubber nozzle 2 is disposed above the chuck stage 8 and discharges the scrubbing fluid 3 to the processing surface of the wafer 1. The scrubber nozzle scan mechanism 11 is grasping the scrubber nozzle 2 and causes the scrubber nozzle 2 to perform a scan on the processing surface of the wafer 1. The stage rotation mechanism 12 is disposed below the chuck stage 8 and rotates the chuck stage 8.

The holding stage 41 includes a holding fluid nozzle 41a (see FIG. 6) that discharges the holding fluid 5 to the surface opposed to the processing surface of the wafer 1 and the top plate 41b having the flat surface facing the surface opposed to the processing surface of the wafer 1 and the holding fluid nozzle 41a is disposed adjacent to a center rather than a periphery portion of the top plate 41b. In the simplest configuration, the top plate 41b has the holding fluid nozzle 41a disposed at the center. The holding stage 41 is incorporated into the chuck stage 8, the holding fluid nozzle 41a does not rotate, and the top plate 41b rotates together with the chuck stage 8.

The operation PC 101 includes a man machine interface (MM-IF) 101a such as a touch panel display and a personal computer (PC) 101b. The control PLC 102 includes a programmable logic controller (PLC) 102a, a gas supply valve 102b and a water supply valve 102c for the holding fluid supply pipe 13, a gas supply valve 102d and a water supply valve 102e for the scrubber nozzle 2, a motor driver 102f for the stage rotation mechanism 12, and a motor driver 102g for the scrubber nozzle scan mechanism 11.

An operator sets a carrier (not shown) containing the wafer 1 into a load port (not shown), selects a recipe pre-registered in the PC 101b on the MM-IF 101a, and inputs a process start. The PC 101b passes a processing parameter specified in the recipe to the PLC 102a to start a series of control operations of the PLC 102a.

The PLC 102a controls a transfer robot (not shown), the processing chamber, and the like. The PLC 102a causes the transfer robot to map wafer loading slots in the carrier and to transfer the wafer 1 between the carrier and the processing chamber, and performs a scrubbing process on the wafer 1 in the processing chamber.

The scrubbing process to be performed in the first preferred embodiment is a process that causes the scrubber nozzle 2 to perform an arc scan or a linear scan passing the center of the wafer 1 while rotating the wafer 1 and causes the scrubbing fluid 3 to uniformly strike the processing surface of the wafer 1 to remove foreign substances adhering to the processing surface of the wafer 1. This requires, as shown in FIG. 4, the scrubber nozzle 2, the scrubber nozzle scan mechanism 11 that causes the scrubber nozzle 2 to perform a scan on the processing surface of the wafer 1, the chuck stage 8 that holds the wafer 1 using the end portion of the chuck stage 8, and the stage rotation mechanism 12 that rotates the chuck stage 8.

Figure 5:
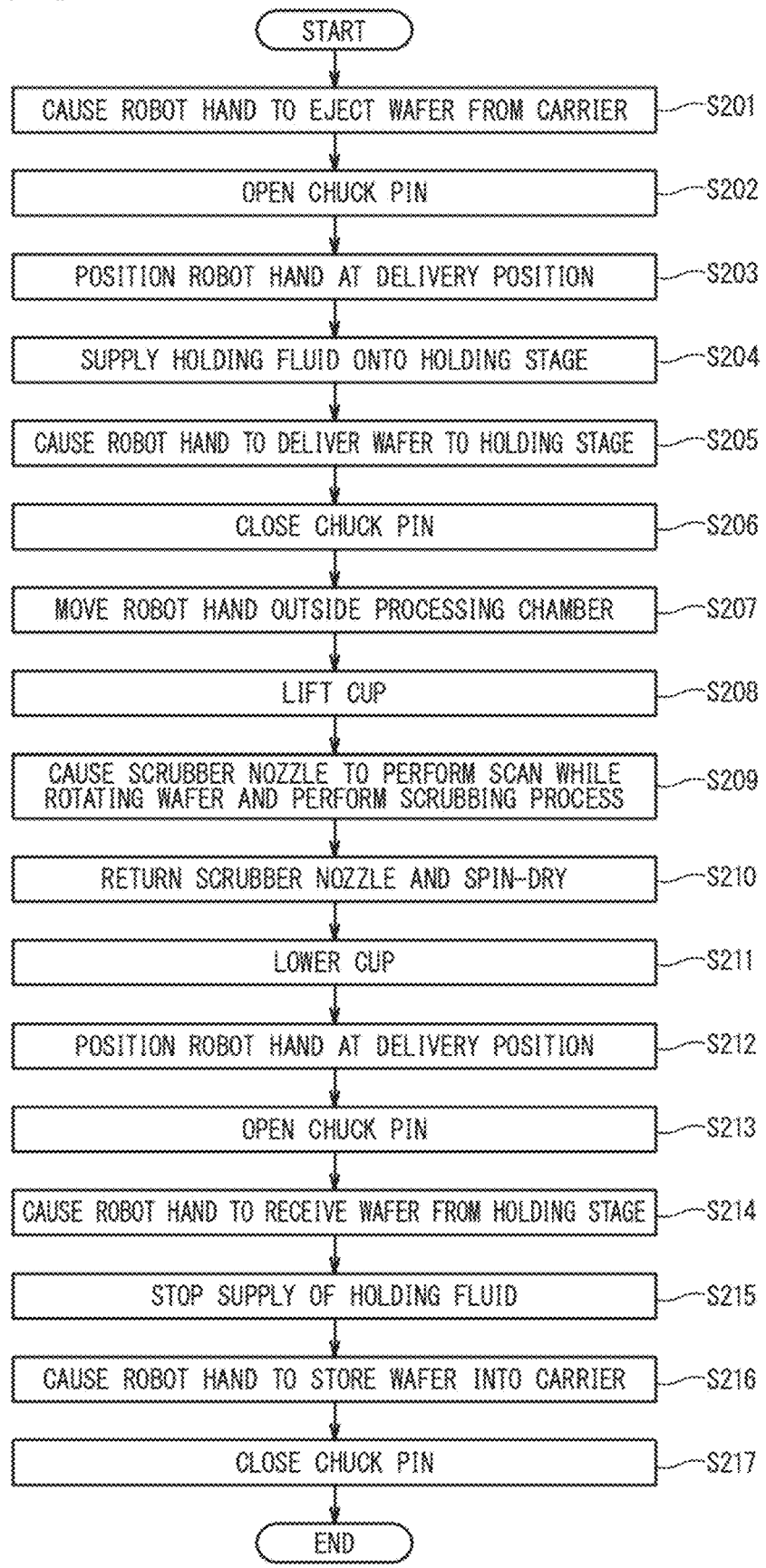
FIG. 5 is a flowchart showing a process of performing a scrubbing process on a wafer in the processing chamber of the semiconductor manufacturing apparatus according to the first preferred embodiment.

Next, a description will be given of a process of performing the scrubbing process on the wafer 1 in the processing chamber. FIG. 5 is a flowchart showing the process of performing the scrubbing process on the wafer 1 in the processing chamber.

The PLC 102a causes a robot hand of the transfer robot to eject, from the carrier, the wafer 1 stored in the carrier in step S201, and rotates the chuck pin bases 8a to open the chuck pins 8b in step S202.

The PLC 102a positions the robot hand at a delivery position over the chuck stage 8 in step S203, and opens the gas supply valve 102b to supply the holding fluid 5 onto the holding stage 41 (or the holding stage 42) in step S204.

The PLC 102a causes the robot hand to deliver the wafer 1 to the holding stage 41 (or the holding stage 42) in step S205, and rotates the chuck pin bases 8a to close the chuck pins 8b in step S206. As a result, the wafer 1 is loaded on the holding stage 41 (or the holding stage 42).

The PLC 102a moves the robot hand outside the processing chamber in step S207, and lifts a cup (not shown) for collecting droplets generated during the scrubbing process up to the periphery of the chuck stage 8 in step S208.

In step S209, the PLC 102a causes the stage rotation mechanism 12 to rotate the wafer 1 together with the chuck stage 8, opens the gas supply valve 102d and the water supply valve 102e to discharge the scrubbing fluid 3 from the scrubber nozzle 2, causes the scrubber nozzle scan mechanism 11 to perform a scan using the scrubber nozzle 2, and performs the scrubbing process on the processing surface of the wafer 1. Further, as needed, the water supply valve 102c is opened to mix water into the holding fluid 5 that is gas to make the surface opposed to the processing surface subjected to the scrubbing process at the same time.

In step S210, the PLC 102a closes the gas supply valve 102d, the water supply valve 102e, and the water supply valve 102c to stop the scrubbing fluid 3 and the water to be mixed into the holding fluid 5, returns the scrubber nozzle 2 to a standby position, and spin-dries the wafer 1.

The PLC 102a lowers the cup in step S211, positions the robot hand at the delivery position in step S212, and rotates the chuck pin bases 8a to open the chuck pins 8b in step S213.

The PLC 102a causes the robot hand to receive the wafer 1 from the holding stage 41 (or the holding stage 42) in step S214, and closes the gas supply valve 102b to stop the supply of the holding fluid 5 in step S215.

The PLC 102a causes the robot hand to store the wafer 1 into the carrier in step S216, and rotates the chuck pin bases 8a to close the chuck pins 8b in step S217.

Note that, although the steps have been described roughly sequentially for the purpose of simplification, it is needless to say that segmented operation steps are practically in execution in parallel, and various inputs and outputs related to the operations are in execution.

Further, in step S209, a scrubber nozzle scan operation 11a and a stage rotation operation 12a allow the scrubbing fluid 3 to uniformly strike the processing surface of the wafer 1 to remove foreign substances adhering to the processing surface of the wafer 1. Further, although an ability to remove foreign substances is lowered, it is possible to mix water, as needed, into the holding fluid 5 that is gas to cause fine droplets to strike the surface opposed to the processing surface, allowing the surface opposed to the processing surface to be subjected to the scrubbing process at the same time.

Next, a description will be given of a stage structure including the chuck stage 8 and the holding stage 41 incorporated into the chuck stage 8 and a stage structure including the chuck stage 8 and the holding stage 42 incorporated into the chuck stage 8. FIG. 6 is a schematic view showing the stage structure including the chuck stage 8 and the holding stage 41 incorporated into the chuck stage 8.

As shown in FIG. 6, the holding stage 41 includes the holding fluid nozzle 41a, the top plate 41b, and a holding fluid discharge port 41c. The holding fluid nozzle 41a and the top plate 41b are arranged to overlap each other, and a portion of the top plate 41b overlapping the holding fluid nozzle 41a is opened.

As shown in FIG. 4 and FIG. 6, the holding fluid nozzle 41a that is a component of the holding stage 41 is separated from the chuck stage 8 and positioned at the center of the chuck stage 8. The holding fluid nozzle 41a is connected to the holding fluid supply pipe 13 passing through a hollow shaft (not shown) of a motor of the stage rotation mechanism 12 and does not rotate. Further, the top plate 41b that is a component of the holding stage 41 is fixed to the chuck stage 8 and rotates together with the chuck stage 8.

Since the holding fluid nozzle 41a does not rotate, it is required that a distance between the holding fluid nozzle 41a and the surface opposed to the processing surface of the wafer 1 be larger than a distance between the top plate 41b and the surface opposed to the processing surface of the wafer 1 in order to prevent the holding fluid nozzle 41a from coming into contact with the wafer 1 covering the range of the holding fluid nozzle 41a, which makes the holding force lowered. That is, in order to increase the holding force at the center portion, it is important to bring the range of the top plate 41b as close as possible to the range of the holding fluid nozzle 41a.

FIG. 7 is a schematic plan view of the range shown in FIG. 6. In FIG. 7, a scrubbing fluid pressure distribution 3b inside the wafer 1 and a scrubbing fluid pressure distribution 3c at the wafer end portion 1a are shown.

The top plate 41b in the first preferred embodiment has a circular outer shape, and a value resulting from subtracting an outer diameter of the top plate 41b from an outer diameter of the wafer 1 is equal to or less than 4 mm so that the top plate 41b extends to the vicinity of the positions where the chuck pins 8b hold the wafer end portion 1a on upper surface sides of the chuck pin bases 8a. That is, when the wafer 1 and the top plate 41b are concentric, the end portion of the top plate 41b is located within a range up to 2 mm inward from the wafer end portion 1a except a notch and an orientation flat. This allows the wafer 1 to be sufficiently held even when the scrubber nozzle 2 performs a scan on a general outermost position (about 3 mm) of a device acquisition effective area.

The wafer-holding pressure 6 is getting smaller due to that a loss of pressure applied to the holding fluid 5 is getting smaller as a distance from the holding fluid discharge port 41c becomes larger, the wafer-holding pulling force 7 is getting smaller due to that the flow velocity of the holding fluid 5a is getting lower as the distance from the holding fluid discharge port 41c becomes larger, and the holding force including the wafer-holding pressure 6 and the wafer-holding pulling force 7 is getting smaller as the distance from the holding fluid discharge port 41c becomes larger.

As an actual result in the first preferred embodiment, in a configuration where the scrubber nozzle 2 is a two-fluid nozzle that discharges a mixture of liquid and gas and the holding fluid nozzle 41a is a nozzle that discharges gas, with the wafer 1 that is a 6-inch wafer and processed to have a thickness of about 100 μm, when the flow rate of gas discharged from the scrubber nozzle 2 is in the range of from 50 L/min to 150 L/min both inclusive, and the flow rate of the holding fluid 5 that is gas discharged from the holding fluid nozzle 41a is equal to or greater than a half of the flow rate of the gas discharged from the scrubber nozzle 2, the surface opposed to the processing surface of the wafer 1 never comes into contact with the top plate 41b.

Taking an increase in diameter of the wafer 1 into consideration, it is conceivable, in order to secure the holding force at the wafer end portion 1a, to simply increase supply pressure applied to the holding fluid 5 to raise the flow rate of the holding fluid 5a. However, when the holding fluid discharge port 41c is provided only at one position that is the center of the holding fluid nozzle 41a as with the holding stage 41, the discharged gas is concentrated in the center, which may cause damage to the wafer 1, particularly, the wafer 1 processed to be thin.

Therefore, it is effective, in order to compensate for the decrease in holding force in the vicinity of the holding fluid discharge port 41c, to provide a plurality of discharge ports for the holding fluid 5a dispersedly at suitable positions to raise the flow rate of the holding fluid 5a.

Figure 8:
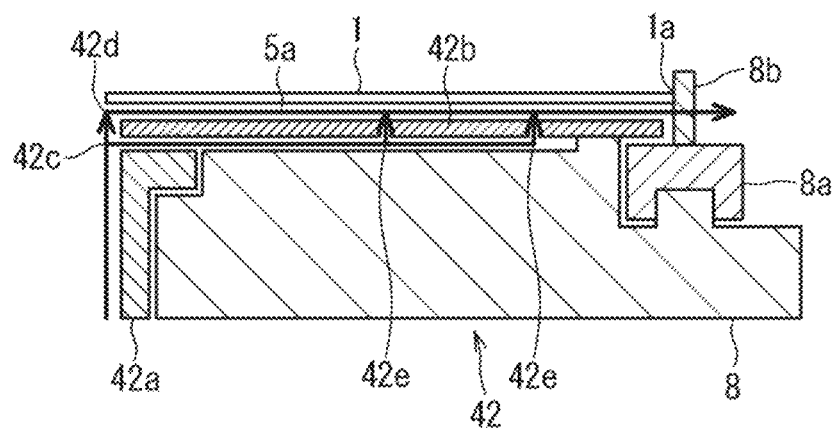
FIG. 8 is a schematic view showing the stage structure including the chuck stage and the holding stage incorporated into the chuck stage of the semiconductor manufacturing apparatus according to the first preferred embodiment.

FIG. 8 is a schematic view showing a stage structure including the chuck stage 8 and the holding stage 42 incorporated into the chuck stage 8.

As shown in FIG. 8, the holding stage 42 includes a holding fluid nozzle 42a, a top plate 42b, a holding fluid discharge port 42c, a top plate central discharge port 42d, and a top plate peripheral discharge port 42e.

The holding fluid nozzle 42a and the top plate 42b are arranged to overlap each other with a gap provided between the holding fluid nozzle 42a and the top plate 42b, and the holding fluid 5 is caused to flow through the gap to a surface opposed to a flat surface that is the other main surface of the top plate 42b and then flow through the top plate central discharge port 42d and the top plate peripheral discharge port 42e that are a plurality of holes provided in the top plate 42b from the surface opposed to the flat surface to the flat surface of the top plate 42b.

The holding fluid nozzle 42a that is a component of the holding stage 42 is separated from the chuck stage 8 and positioned at the center of the chuck stage 8. The holding fluid nozzle 42a is connected to the holding fluid supply pipe 13 passing through a hollow shaft (not shown) of a motor of the stage rotation mechanism 12 and does not rotate. Further, the top plate 42b that is a component of the holding stage 42 is fixed to the chuck stage 8 and rotates together with the chuck stage 8.

Figure 9:
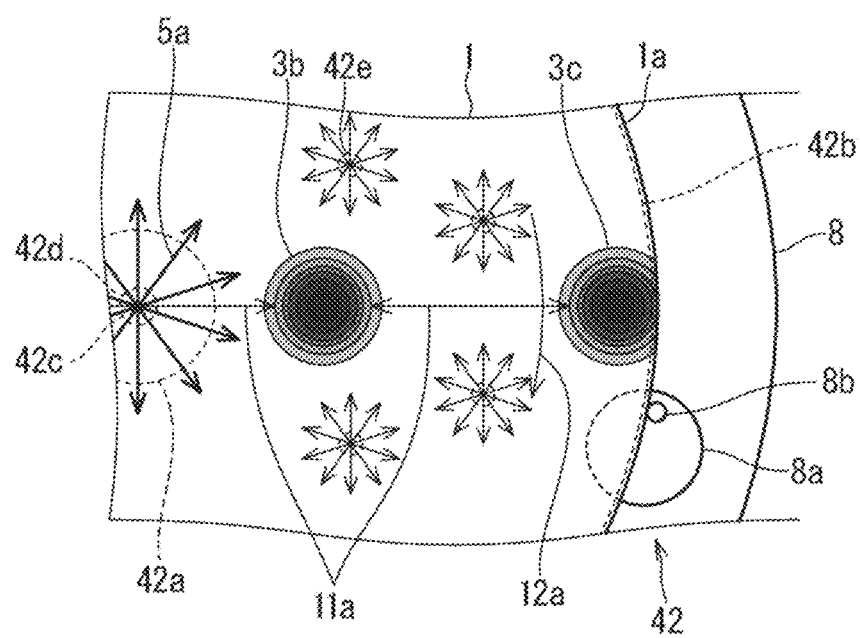
FIG. 9 is a schematic plan view of the range shown in FIG. 8.

FIG. 9 is a schematic plan view of the range shown in FIG. 8. The top plate 42b in the first preferred embodiment has a circular outer shape, and a value resulting from subtracting an outer diameter of the top plate 42b from the outer diameter of the wafer 1 is equal to or less than 4 mm so that the top plate 42b extends to the vicinity of the positions where the chuck pins 8b hold the wafer end portion 1a on the upper surface sides of the chuck pin bases 8a. That is, when the wafer 1 and the top plate 42b are concentric, the end portion of the top plate 42b is located within a range up to 2 mm inward from the wafer end portion 1a except a notch and an orientation flat, and even when the scrubber nozzle 2 performs a scan on a general outermost position (about 3 mm) of the device acquisition effective area, the wafer 1 can be sufficiently held.

The holding fluid 5 is composed of a portion corresponding to the holding fluid 5a that passes through the top plate central discharge port 42d and flows between the wafer 1 and the top plate 42b and a portion that passes through the top plate peripheral discharge port 42e and joins the holding fluid 5a on the way, which causes the holding fluid 5a to increase for each joining.

Note that the portion that passes through the top plate peripheral discharge port 42e and joins the holding fluid 5a on the way needs to have a flow rate that does not significantly impede the flow of the holding fluid 5a, and thus it is preferable that small top plate peripheral discharge ports 42e be dispersedly provided at a number of positions. Since the flow rate of the holding fluid 5a on the periphery can be largely raised with the holding stage 42 compared with the holding stage 41, it is possible to suppress the decrease in pressure of the holding fluid 5a and pulling force produced by the flow rate of the holding fluid 5a to compensate for the decrease in holding force in the vicinity of the holding fluid discharge port 42c.

Effect

As described above, in the semiconductor manufacturing apparatus according to the first preferred embodiment, the holding fluid 5 discharged from the holding fluid nozzle 41a, 42a is caused to flow through an area between the surface opposed to the processing surface of the wafer 1 and the flat surface of the top plate 41b, 42b to produce the holding force in the area, and the holding force causes the surface opposed to the processing surface to hold the pressure applied to the processing surface of the wafer 1 by the scrubbing fluid 3 discharged from the scrubber nozzle 2. Therefore, even when the wafer 1 is processed to be thin, an ability to remove foreign substances all over a wafer to a satisfactory degree can be obtained.

The holding force includes the pressure of the holding fluid 5a and the pulling force produced by the flow rate of the holding fluid 5a, so that the wafer 1 can be stably held.

The holding stage 41, 42 is incorporated into the chuck stage 8, the holding fluid nozzle 41a, 42a does not rotate, and the top plate 41b, 42b rotates together with the chuck stage 8. Therefore, combining the chuck stage 8 and the holding stage 41, 42 into a single unit makes the structure simple.

The top plate 41b, 42b has a circular outer shape, and a value resulting from subtracting the outer diameter of the top plate 41b, 42b from the outer diameter of the wafer 1 is equal to or less than 4 mm. Therefore, when the outer shape of the top plate 41b, 42b almost entirely covers the wafer 1, the scan function of the holding stage 41, 42 becomes unnecessary.

The holding fluid nozzle 41a and the top plate 41b are arranged to overlap each other, and a portion of the top plate 41b overlapping the holding fluid nozzle 41a is opened. Therefore, setting an area other than the portion of the top plate 41b overlapping the holding fluid nozzle 41a that is fixed as the range of the top plate 41b that rotates makes it possible to increase the holding force at the center portion of the top plate 41b.

The holding fluid nozzle 42a and the top plate 42b are arranged to overlap each other with a gap provided between the holding fluid nozzle 42a and the top plate 42b, and the holding fluid 5 is caused to flow through the gap to a surface opposed to a flat surface of the top plate 42b and then flow through the top plate central discharge port 42d and the top plate peripheral discharge port 42e provided in the top plate 42b from the surface opposed to the flat surface to the flat surface of the top plate 42b. Therefore, an increase in flow rate of the holding fluid 5a on the periphery allows the diameter of the wafer 1 to be increased.

The scrubber nozzle 2 is a two-fluid nozzle that discharges a mixture of liquid and gas, the holding fluid nozzle 41a, 42a is a nozzle capable of discharging only gas or a mixture of gas and liquid, and thus both the processing surface and the surface opposed to the processing surface of the wafer 1 are subjected to the scrubbing process. Therefore, it is possible to effectively remove foreign substances adhering to both the processing surface and the surface opposed to the processing surface of the wafer 1.

The scrubber nozzle 2 is a two-fluid nozzle that discharges a mixture of liquid and gas, the holding fluid nozzle 41a is a nozzle capable of discharging only gas or a mixture of gas and liquid, and the flow rate of gas discharged from the holding fluid nozzle 41a is equal to or greater than a half of the flow rate of gas discharged from the scrubber nozzle 2. Therefore, it is possible to prevent the surface opposed to the processing surface of the wafer 1 from coming into contact with the top plate 41b.

Second Preferred Embodiment

Figure 10:
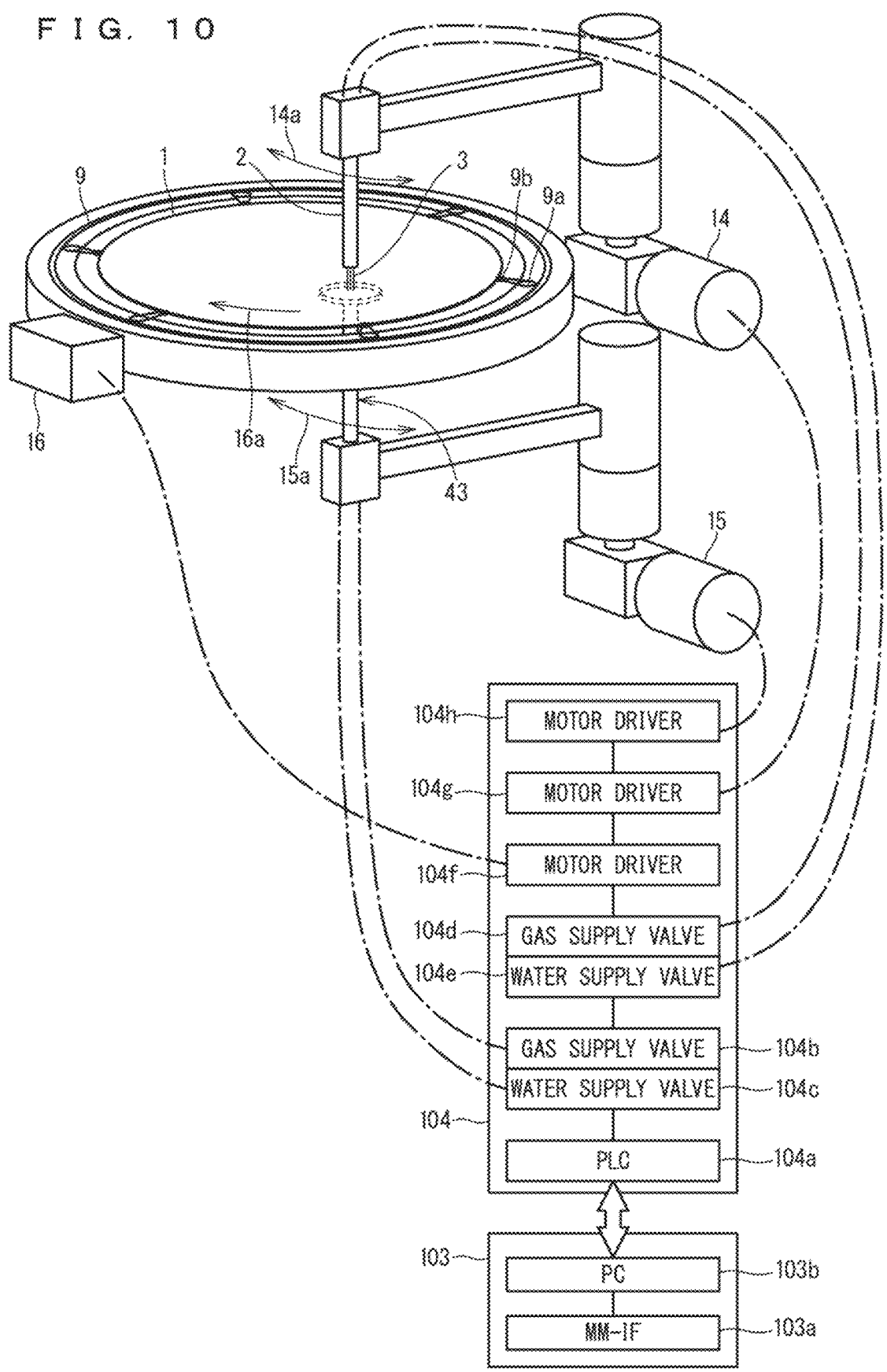
FIG. 10 is a schematic view showing a part of a processing chamber of a semiconductor manufacturing apparatus according to a second preferred embodiment.

Next, a description will be given of a semiconductor manufacturing apparatus according to a second preferred embodiment. FIG. 10 is a schematic view showing a part of a processing chamber of the semiconductor manufacturing apparatus according to the second preferred embodiment. Note that, in the second preferred embodiment, the same components as those described in the first preferred embodiment are denoted by the same reference numerals, and descriptions thereof will be omitted. Note that, for the sake of easy viewing, a portion that is not directly related to the technique for removing foreign substances will be omitted from the drawings, and, for the purpose of simplification, a description will be given only of a portion related to the technique for removing foreign substances.

As shown in FIG. 10, the semiconductor manufacturing apparatus includes a chuck stage 9, a scrubber nozzle 2, a scrubber nozzle scan mechanism 14, a holding stage scan mechanism 15, a stage rotation mechanism 16, a holding stage 43, an operation PC 103, and a control PLC 104.

The chuck stage 9 has an annular shape in plan view and holds the wafer 1 using an end portion of the chuck stage 9. Specifically, a plurality of chuck pin bases 9a are arranged at predetermined intervals on the periphery portion of the chuck stage 9, and a plurality of chuck pins 9b are provided on the plurality of chuck pin bases 9a. Each of the chuck pins 9b is movable between an outer circumferential side and an inner circumferential side. Moving the plurality of chuck pins 9b to the outer circumferential side to open the plurality of chuck pins 9b allows the wafer 1 to be loaded onto the chuck stage 9. Further, moving the plurality of chuck pins 9b to the inner circumferential side to close the plurality of chuck pins 9b causes the plurality of chuck pins 9b to hold the end portion of the wafer 1.

The scrubber nozzle scan mechanism 14 is grasping the scrubber nozzle 2 and causes the scrubber nozzle 2 to perform a scan on the processing surface of the wafer 1. The stage rotation mechanism 16 is disposed on the outer circumferential side of the chuck stage 9 and rotates the chuck stage 9.

The holding stage 43 includes a holding fluid nozzle 43a (see FIG. 12) and the top plate 43b, the holding fluid nozzle 43a discharges the holding fluid 5 to the surface opposed to the processing surface of the wafer 1, and the top plate 43b has a flat surface facing the surface opposed to the processing surface of the wafer 1 and the holding fluid nozzle 43a is disposed adjacent to a center rather than a periphery portion of the top plate 43b. In the simplest configuration, the top plate 43b has the holding fluid nozzle 43a disposed at the center. The top plate 43b has a circular outer shape, and the chuck stage 9 is disposed on the outer circumferential side of the holding stage 43. The holding stage scan mechanism 15 is grasping the holding stage 43 and causes the holding stage 43 to perform a scan.

The operation PC 103 includes a man machine interface (MM-IF) 103a such as a touch panel display and a personal computer (PC) 103b. The control PLC 104 includes a programmable logic controller (PLC) 104a, a gas supply valve 104b and a water supply valve 104c for the holding stage 43, a gas supply valve 104d and a water supply valve 104e for the scrubber nozzle 2, a motor driver 104f for the stage rotation mechanism 16, a motor driver 104g for the scrubber nozzle scan mechanism 14, and a motor driver 104h for the holding stage scan mechanism 15.

The operator sets a carrier (not shown) containing the wafer 1 into a load port (not shown), selects a recipe pre-registered in the PC 103b on the MM-IF 103a, and inputs a process start. The PC 103b passes a processing parameter specified in the recipe to the PLC 104a to start a series of control operations of the PLC 104a.

The PLC 104a controls a transfer robot (not shown), the processing chamber, and the like, causes the transfer robot to map wafer loading slots in the carrier and to transfer the wafer 1 between the carrier and the processing chamber, and performs a scrubbing process on the wafer 1 in the processing chamber.

The scrubbing process to be performed in the second preferred embodiment is a process that causes the scrubber nozzle 2 to perform an arc scan or a linear scan passing the center of the wafer 1 while rotating the wafer 1 and causes the scrubbing fluid 3 to uniformly strike the processing surface of the wafer 1 to remove foreign substances adhering to the processing surface of the wafer 1. This requires, as shown in FIG. 10, the scrubber nozzle 2, the scrubber nozzle scan mechanism 14 that causes the scrubber nozzle 2 to perform a scan on the processing surface of the wafer 1, the chuck stage 9 that holds the wafer 1 using the end portion of the chuck stage 9, and the stage rotation mechanism 16 that rotates the chuck stage 9.

Figure 11:
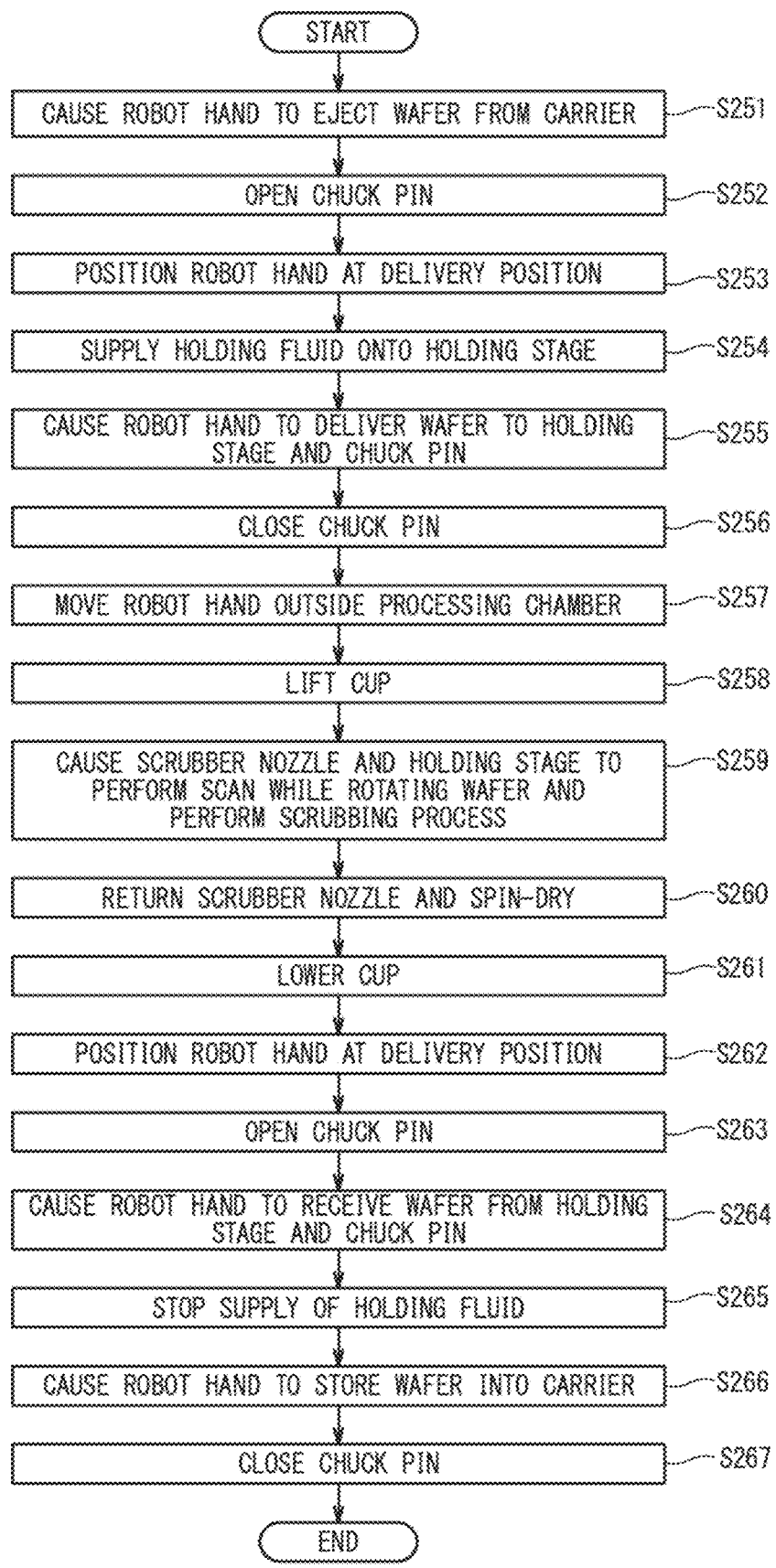
FIG. 11 is a flowchart showing a process of performing a scrubbing process on a wafer in the processing chamber of the semiconductor manufacturing apparatus according to the second preferred embodiment.

Next, a description will be given of a process of performing the scrubbing process on the wafer 1 in the processing chamber. FIG. 11 is a flowchart showing the process of performing the scrubbing process on the wafer 1 in the processing chamber.

The PLC 104a causes a robot hand of the transfer robot to eject, from the carrier, the wafer 1 stored in the carrier in step S251, and rotates the chuck pin bases 9a to open the chuck pins 9b in step S252.

The PLC 104a positions the robot hand at a delivery position over the chuck stage 9 in step S253, and opens the gas supply valve 104b to supply the holding fluid 5 onto the holding stage 43 in step S254.

The PLC 104a causes the robot hand to deliver the wafer 1 to the holding stage 43 and the chuck pins 9b in step S255, and rotates the chuck pin bases 9a to close the chuck pins 9b in step S256. As a result, the wafer 1 is loaded on the holding stage 43.

The PLC 104a moves the robot hand outside the processing chamber in step S257, and lifts a cup (not shown) for collecting droplets generated during the scrubbing process up to the periphery of the chuck stage 9 in step S258.

In step S259, the PLC 104a causes the stage rotation mechanism 16 to rotate the wafer 1 together with the chuck stage 9, opens the gas supply valve 104d and the water supply valve 104e to discharge the scrubbing fluid 3 from the scrubber nozzle 2, causes the scrubber nozzle scan mechanism 14 to perform a scan using the scrubber nozzle 2, and performs the scrubbing process on the processing surface of the wafer 1. At this time, the holding stage scan mechanism 15 causes the holding stage 43 to perform a scan so that an area where the holding stage 43 produces the holding force includes a section corresponding to a range of the processing surface of the wafer 1 where pressure equal to or greater than a predetermined degree is locally applied by the scrubbing fluid 3 discharged from the scrubber nozzle 2. Further, as needed, the water supply valve 104c is opened to mix water into the holding fluid 5 that is gas to make the surface opposed to the processing surface of the wafer 1 subjected to the scrubbing process at the same time.

In step S260, the PLC 104a closes the gas supply valve 104d, the water supply valve 104e, and the water supply valve 104c to stop the scrubbing fluid 3 and the water to be mixed into the holding fluid 5, returns the scrubber nozzle 2 to a standby position, and spin-dries the wafer 1.

The PLC 104a lowers the cup in step S261, positions the robot hand at the delivery position in step S262, and rotates the chuck pin bases 9a to open the chuck pins 9b in step S263.

The PLC 104a causes the robot hand to receive the wafer 1 from the holding stage 43 and the chuck pins 9b in step S264, and closes the gas supply valve 104b to stop the holding fluid 5 in step S265.

The PLC 104a causes the robot hand to store the wafer 1 into the carrier in step S266, and rotates the chuck pin bases 9a to close the chuck pins 9b in step S267.

Note that, although the steps have been described roughly sequentially for the purpose of simplification, it is needless to say that segmented operation steps are practically in execution in parallel, and various inputs and outputs related to the operations are in execution.

Further, in step S259, a scrubber nozzle scan operation 14a and a stage rotation operation 16a allow the scrubbing fluid 3 to uniformly strike the processing surface of the wafer 1 to remove foreign substances adhering to the processing surface of the wafer 1. Further, although an ability to remove foreign substances is lowered, it is possible to mix water, as needed, into the holding fluid 5 that is gas to cause fine droplets to strike the surface opposed to the processing surface of the wafer 1, allowing the surface opposed to the processing surface to be subjected to the scrubbing process at the same time.

Figure 12:
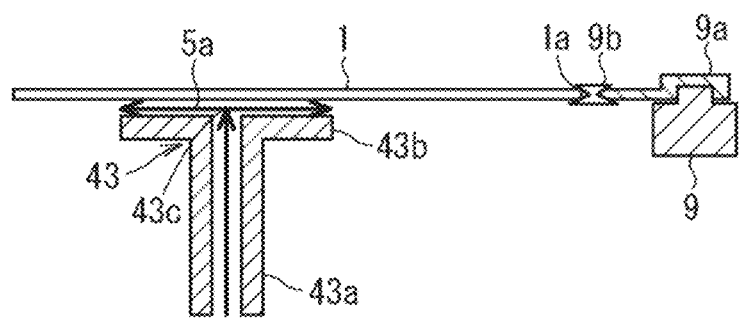
FIG. 12 is a schematic view showing a stage structure including a chuck stage and a holding stage of the semiconductor manufacturing apparatus according to the second preferred embodiment.

FIG. 12 is a schematic view showing a stage structure including the chuck stage 9 and the holding stage 43. As shown in FIG. 12, the holding stage 43 includes the holding fluid nozzle 43a, the top plate 43b, and a holding fluid discharge port 43c.

Each of the chuck pins 9b has a flange that widely supports the wafer end portion 1a from below, and prevents the wafer 1 from warping or dropping off when being delivered to and from the robot hand. The holding fluid nozzle 43a and the top plate 43b that are components of the holding stage 43 are combined into a single unit, and the holding stage 43 is separated from the chuck stage 9. That is, the holding stage 43 is not incorporated into the chuck stage 9.

Figure 13:
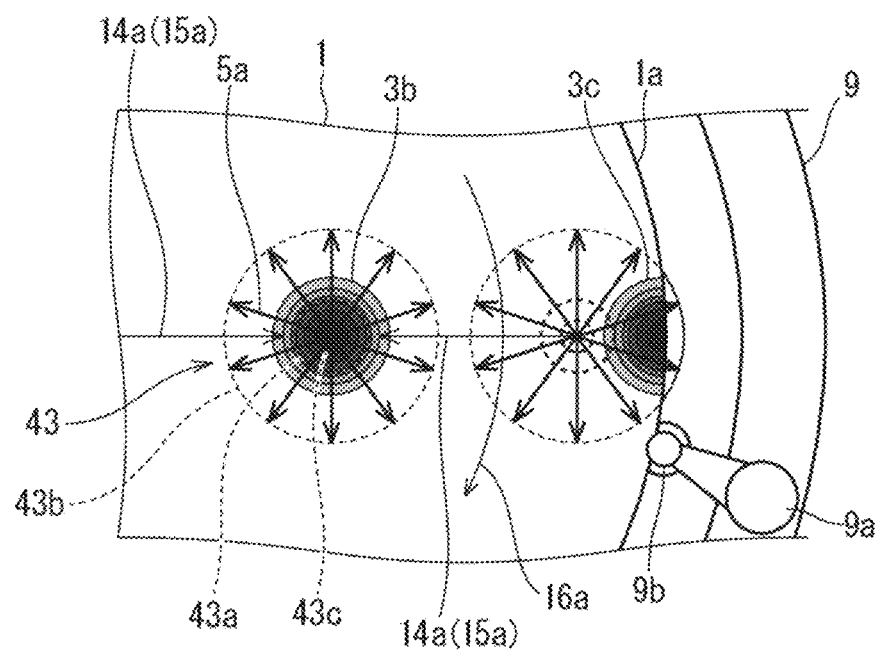
FIG. 13 is a schematic plan view of the range shown in FIG. 12.

FIG. 13 is a schematic plan view of the range shown in FIG. 12. As shown in FIG. 13, the top plate 43b in the second preferred embodiment has a circular outer shape, and the flat surface of the top plate 43b has an area that is sufficiently larger than a section corresponding to the range of the processing surface of the wafer 1 where pressure equal to or greater than a predetermined degree is locally applied by the scrubbing fluid 3 discharged from the scrubber nozzle 2.

The holding stage scan mechanism 15 performs a holding stage scan operation 15a in sync with the scrubber nozzle scan operation 14a so that an area where the holding stage 43 produces the holding force includes the section corresponding to the range of the processing surface of the wafer 1 where pressure equal to or greater than a predetermined degree is locally applied by the scrubbing fluid 3 discharged from the scrubber nozzle 2. In this case, the holding fluid discharge port 43c of the holding fluid nozzle 43a needs to be within the range of the wafer 1 so as to prevent the holding fluid 5a from blowing up to the processing surface of the wafer 1 to affect the scrubbing fluid 3.

Figure 14:
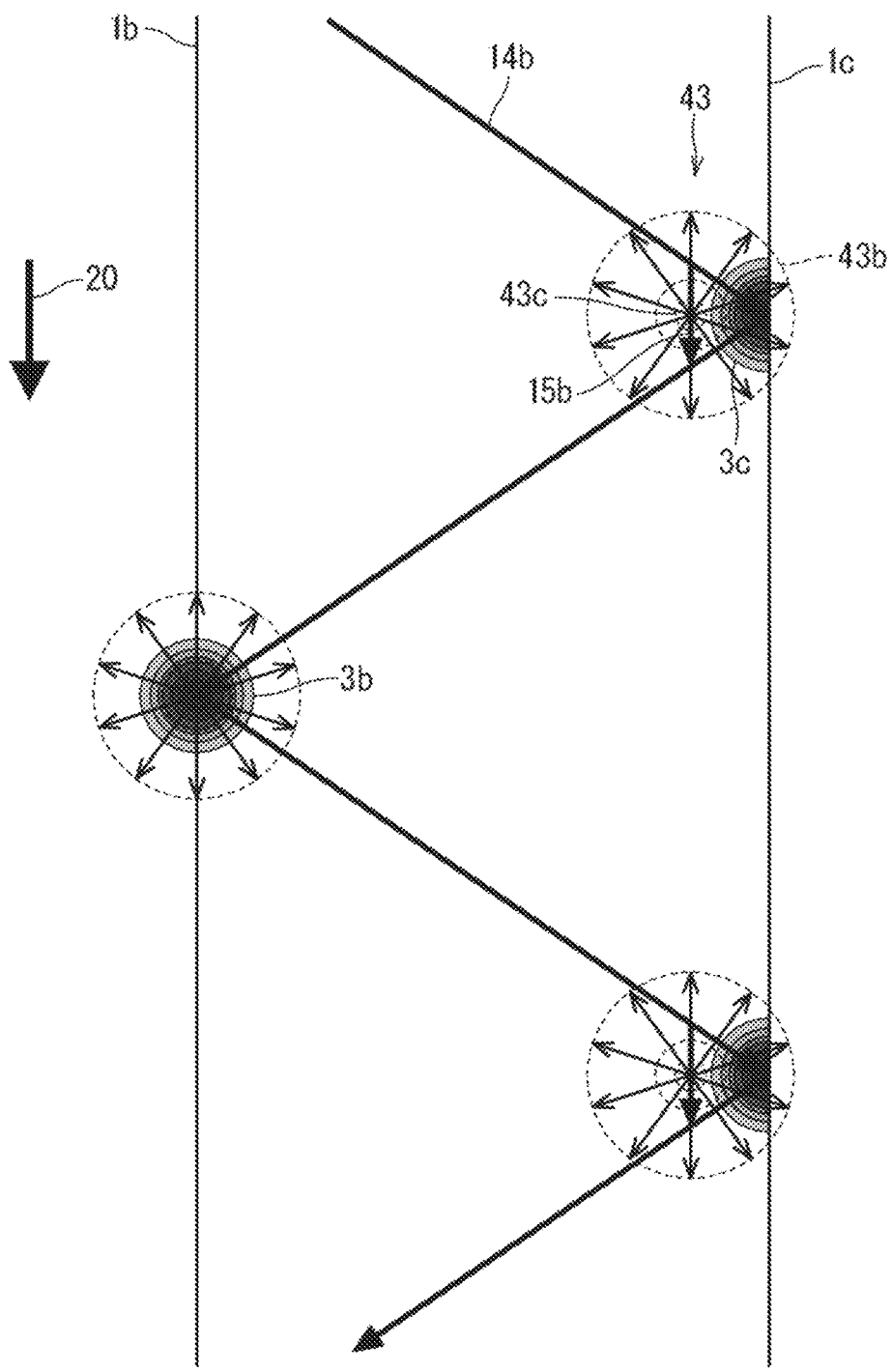
FIG. 14 is a schematic view showing one example of a scrubber nozzle scan operation and a holding stage scan operation of the semiconductor manufacturing apparatus according to the second preferred embodiment.
Figure 15:
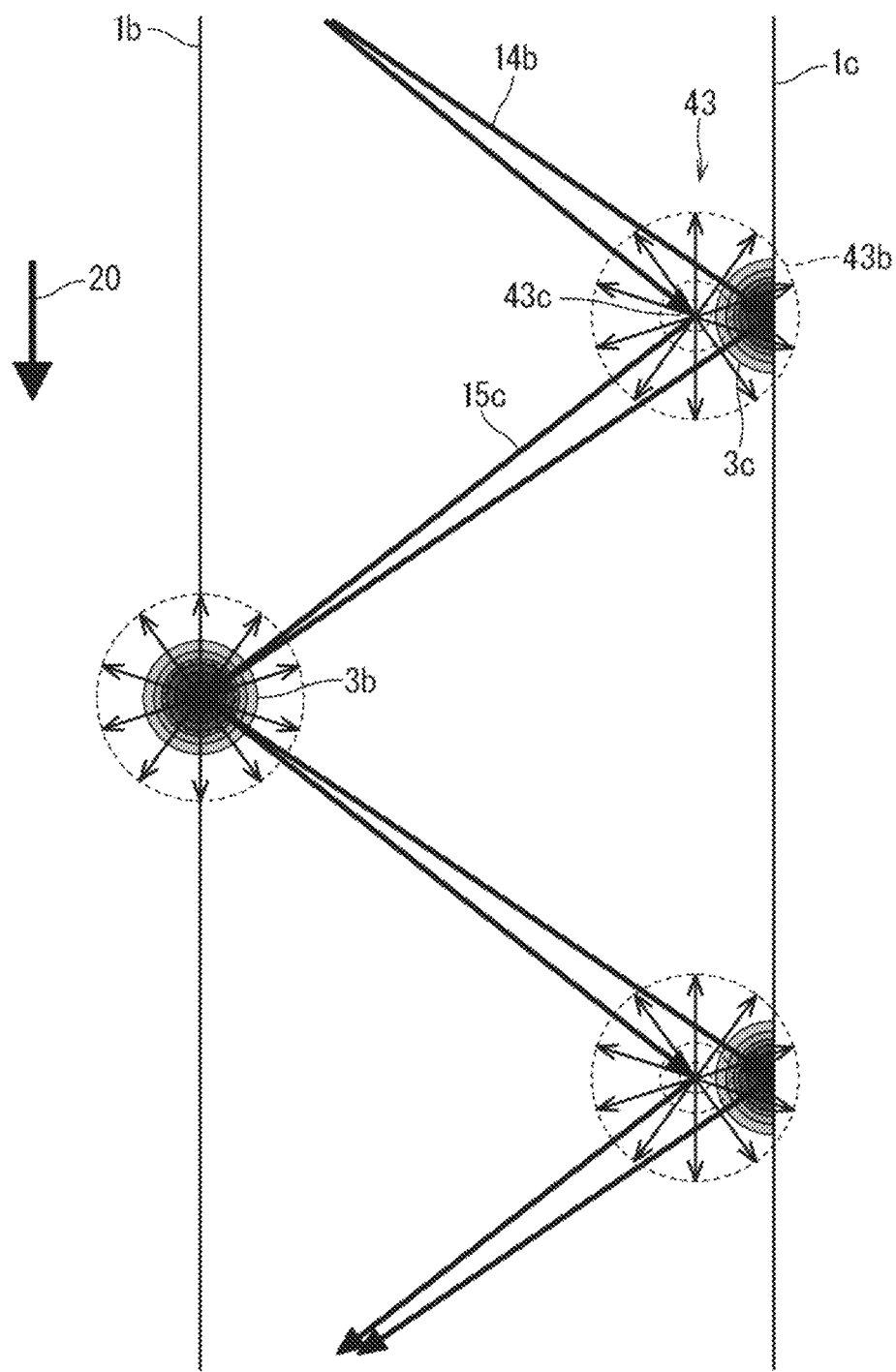
FIG. 15 is a schematic view showing another example of the scrubber nozzle scan operation and the holding stage scan operation of the semiconductor manufacturing apparatus according to the second preferred embodiment.

FIG. 14 is a schematic diagram showing one example of the scrubber nozzle scan operation 14a and the holding stage scan operation 15a. FIG. 15 is a schematic diagram showing another example of the scrubber nozzle scan operation 14a and the holding stage scan operation 15a. In FIG. 14 and FIG. 15, 1b denotes a position of the wafer center portion, 1c denotes a position of the wafer end portion, 14b denotes a path of the scrubber nozzle scan operation 14a, 15b and 15c denote paths of the holding stage scan operation 15a, and 20 denotes a time axis.

As shown in FIG. 14, when the scrubber nozzle 2 moves from the position 1b of the wafer center portion toward the position 1c of the wafer end portion, the scrubber nozzle 2 and the holding stage 43 first move along the path 14b with their centers aligned with each other. However, the holding stage 43 changes a path from the path 14b to the path 15b on the way to the end portion of the wafer 1 and does not further move toward the end portion of the wafer 1. When the scrubber nozzle 2 moves from the position 1c of the wafer end portion toward the position 1b of the wafer center portion, the reverse operation is performed.

As shown in FIG. 15, the scrubber nozzle 2 and the holding stage 43 have their respective centers aligned with each other at the position 1b of the wafer center portion, but as the holding stage 43 moves toward the position 1c of the wafer end portion, the holding stage 43 is gradually separated from the scrubber nozzle 2, and even when the scrubber nozzle 2 comes to the position 1c of the wafer end portion, the holding stage 43 moves only partway and does not further move toward the end portion of the wafer 1. When the holding stage 43 moves from the position 1c of the wafer end portion toward the position 1b of the wafer center portion, the reverse operation is performed.

Either of the operations shown in FIG. 14 and FIG. 15 is performed so that the area where the holding stage 43 produces the holding force includes the section corresponding to the range of the processing surface of the wafer 1 where pressure equal to or greater than a predetermined degree is locally applied by the scrubbing fluid 3 discharged from the scrubber nozzle 2.

Effect

As described above, the semiconductor manufacturing apparatus according to the second preferred embodiment further includes the holding stage scan mechanism 15 that causes the holding stage 43 to perform a scan, and the holding stage scan mechanism 15 causes the holding stage 43 to perform the scan in sync with the scan of the scrubber nozzle 2 so as not to cause the holding fluid discharge port 43c of the holding fluid nozzle 43a to move outside the range of the wafer 1. Therefore, although the structure becomes complicated as compared in the first preferred embodiment, the top plate 43b can be made smaller, and thus a difference in holding force between the center and the periphery of the top plate 43b can be made smaller.

The chuck stage 9 has an annular outer shape, the top plate 43b has a circular outer shape, and the chuck stage 9 is disposed on the outer circumferential side of the holding stage 43, thereby making it possible to cause the holding stage 43 to smoothly perform a scan in sync with the scan of the scrubber nozzle 2.

In either of the first and second preferred embodiments, since the holding force is applied to the surface opposed to the processing surface of the wafer 1 within the range of the processing surface of the wafer 1 where pressure equal to or greater than a predetermined degree is locally applied by the scrubbing fluid 3 discharged from the scrubber nozzle 2, a stage structure prevents the surface opposed to the processing surface from being brought into contact with parts of a mechanism. Furthermore, since no support pin from which a crack starts is used, a semiconductor manufacturing apparatus and a semiconductor manufacturing method that have an ability to remove foreign substances all over even a wafer processed to be thin to a satisfactory degree can be provided.

Note that major differences between the first and second preferred embodiments are the size of the top plate and whether to cause the holding stage to perform a scan. The first preferred embodiment has a structure in which a rotation shaft is provided at the center of stage rotation conventionally used, which eliminates the need for the scan mechanism of the holding stage and thus makes the structure simple. On the other hand, in the second preferred embodiment, although the structure becomes complicated, the top plate can be made smaller, so that the difference in holding force between the center and the periphery of the top plate can be made smaller. In a case where the holding force on the periphery of the top plate is uniform, the smaller the top plate is, the lower the flow rate of the holding fluid becomes.

Further, it is conceivable that a configuration constituted by the best of both the first and second preferred embodiments is employed in which the scan mechanism of the holding stage is eliminated from the second preferred embodiment, a plurality of holding fluid discharge ports of the holding stage are arranged on the path of the scan operation of the scrubber nozzle, and the top plate is shaped to cover all areas around the plurality of holding fluid discharge ports, and the like, which is one of the preferred embodiments of the present invention.

While the invention has been shown and described in detail, the foregoing description is in all aspects illustrative and not restrictive. It is therefore understood that numerous modifications and variations can be devised without departing from the scope of the invention.

Note that the present invention can be implemented by any combination of the preferred embodiments within the scope of the present invention, and each of the preferred embodiments can be modified or omitted as appropriate.

What is claimed is:

1. A semiconductor manufacturing apparatus comprising:
a chuck stage configured to hold a semiconductor wafer using an end portion of the chuck stage;
a scrubber nozzle configured to discharge a scrubbing fluid to a processing surface of the semiconductor wafer;
a scrubber nozzle scanner configured to cause the scrubber nozzle to perform a scan on the processing surface of the semiconductor wafer;
a stage rotator configured to rotate the chuck stage; and
a holding stage including a holding fluid nozzle and a top plate, the holding fluid nozzle being configured to discharge a holding fluid to an opposite surface of the semiconductor wafer opposed to the processing surface, the top plate having one main surface facing the opposite surface of the semiconductor wafer, and the holding fluid nozzle being disposed adjacent to a center rather than a periphery portion of the top plate,
wherein
the holding fluid discharged from the holding fluid nozzle is caused to flow through an area between the opposite surface of the semiconductor wafer and the one main surface of the top plate to produce holding force over the area, and
the holding force causes the opposite surface to hold pressure applied by the scrubbing fluid discharged from the scrubber nozzle to the processing surface of the semiconductor wafer,
the holding stage is incorporated into the chuck stage,
the holding fluid nozzle does not rotate,
the top plate rotates together with the chuck stage, the holding fluid nozzle and the top plate are arranged to overlap each other with a gap provided between the holding fluid nozzle and the top plate, and the holding fluid is caused to flow directly from the holding fluid nozzle to the one main surface side of the top plate and to flow through the gap to an other main surface of the top plate and flow through a plurality of holes provided in the top plate from the other main surface of the top plate to the one main surface of the top plate.

2. The semiconductor manufacturing apparatus according to claim 1, wherein the scrubber nozzle is a two-fluid nozzle that discharges a mixture of liquid and gas, the holding fluid nozzle is a nozzle capable of discharging only gas or a mixture of gas and liquid, and the semiconductor manufacturing apparatus is configured to subject both the processing surface and the opposite surface of the semiconductor wafer to a scrubbing process respectively via the scrubbing nozzle and the holding fluid nozzle.

3. The semiconductor manufacturing apparatus according to claim 1, wherein the holding force includes pressure of the holding fluid and pulling force produced by a flow velocity of the holding fluid.

4. The semiconductor manufacturing apparatus according to claim 1, wherein the top plate has a circular outer shape, and a value resulting from subtracting an outer diameter of the top plate from an outer diameter of the semiconductor wafer is equal to or less than 4 mm.

5. The semiconductor manufacturing apparatus according to claim 1, wherein a portion of the top plate overlapping the holding fluid nozzle is opened.

* * * * *